(12) United States Patent
Hinrichs et al.

(10) Patent No.: US 9,099,995 B2
(45) Date of Patent: Aug. 4, 2015

(54) RING OSCILLATOR CIRCUIT AND METHOD

(71) Applicant: QUALCOMM Incorporated, San Diego, CA (US)

(72) Inventors: Jeffrey Mark Hinrichs, San Diego, CA (US); Luis Chen, Chula Vista, CA (US)

(73) Assignee: QUALCOMM Incorporated, San Diego, CA (US)

( * ) Notice: Subject to any disclaimer, the term of this patent is extended or adjusted under 35 U.S.C. 154(b) by 76 days.

(21) Appl. No.: 13/804,366

(22) Filed: Mar. 14, 2013

(65) Prior Publication Data

US 2014/0266475 A1    Sep. 18, 2014

(51) Int. Cl.
*H03K 3/03* (2006.01)
*H03L 7/099* (2006.01)
*H04L 7/033* (2006.01)

(52) U.S. Cl.
CPC ............ *H03K 3/0315* (2013.01); *H03L 7/0995* (2013.01); *H04L 7/033* (2013.01)

(58) Field of Classification Search
CPC ..... H03K 3/0315; H03L 7/0995; H03L 7/093
USPC ........ 331/57, 175, 186, 17, 34; 323/273, 274, 323/280, 281, 279
See application file for complete search history.

(56) References Cited

U.S. PATENT DOCUMENTS

| | | | |
|---|---|---|---|
| 7,038,431 B2 | 5/2006 | Benbrik | |
| 7,436,229 B2 | 10/2008 | Sidiropoulos et al. | |
| 7,973,612 B2 * | 7/2011 | Raghunathan et al. | 331/186 |
| 8,031,027 B2 | 10/2011 | Park et al. | |
| 8,217,690 B2 | 7/2012 | Hu et al. | |
| 8,362,848 B2 * | 1/2013 | Raghunathan et al. | 331/186 |
| 8,878,614 B2 * | 11/2014 | Yin et al. | 331/25 |
| 2002/0039051 A1 * | 4/2002 | Ito et al. | 331/25 |
| 2004/0251973 A1 | 12/2004 | Ishida et al. | |
| 2006/0119441 A1 | 6/2006 | Azam et al. | |
| 2011/0006819 A1 | 1/2011 | Bazes | |

FOREIGN PATENT DOCUMENTS

| | | |
|---|---|---|
| EP | 1229419 A2 | 8/2002 |
| EP | 1777603 A1 | 4/2007 |

OTHER PUBLICATIONS

Crossley et al., "An Energy-Efficient Ring-Oscillator Digital PLL", Custom Integrated Circuits Conference (CICC), 2010 IEEE. IEEE, 2010.*
Arakali, et al., "Low-Power Supply-Regulation Techniques for Ring Oscillators in Phase-Locked Loops Using a Split Tuned Architecture," IEEE J. Solid State Circuits, vol. 44, No. 8, pp. 2169-2181, Aug. 2009.

(Continued)

*Primary Examiner* — Ryan Johnson
(74) *Attorney, Agent, or Firm* — Patterson & Sheridan, L.L.P.

(57) ABSTRACT

Oscillator circuits and methods are disclosed. In an embodiment, a circuit includes a voltage controlled oscillator (VCO) and a regulator coupled to a supply input of the VCO. The circuit also includes an oscillation dampening circuit coupled to an output of the regulator. A resistance or a capacitance of the oscillation dampening circuit is configured to vary based on current provided to the VCO.

24 Claims, 10 Drawing Sheets

(56) References Cited

OTHER PUBLICATIONS

Hwang I.C., "A 0.236 mm2, 3.99 mW Fully Integrated 90 nm CMOS L1/L5 GPS Frequency Synthesizer Using a Regulated Ring VCO", IEEE Microwave and Wireless Components Letters, vol. 22, No. 6, Jun. 2012, pp. 324-326.

Lim P.J., "An Area-Efficient PLL Architecture in 90-nm CMOS", 2005 Symposium on VLSI Circuits Digest of Technical Papers, 2005, pp. 48-49.

Shi C., et al., "A Highly Integrated Power Management IC for Advanced Mobile Applications", IEEE Journal of Solid State Circuits, vol. 42, No. 8, Aug. 2007, pp. 1723-1731.

Toifl T., et al., A1.25-5 GHz Clock GeneratorWith High-Bandwidth Supply-Rejection Using a Regulated-Replica Regulator in 45-nm CMOS, IEEE Journal of Solid-State Circuits, vol. 44, No. 11, Nov. 2009, pp. 2901-2910.

Ahn, et al., "A Low-Jitter 1.9-V CMOS PLL for UltraSPARC Microprocessor Applications", IEEE Journal of Solid-State Circuits, vol. 35, No. 3, Mar. 2000, XP011061193, pp. 450-454.

International Search Report and Written Opinion—PCT/US2014/021923—ISA/EPO—Jun. 6, 2014.

\* cited by examiner

RING OSCILLATOR CIRCUIT AND METHOD

I. FIELD

The present disclosure is generally related to oscillators, more particularly to supply regulated ring oscillators.

II. DESCRIPTION OF RELATED ART

Ring oscillators may be used to provide an oscillating output signal. An oscillation frequency of the output signal is responsive to a voltage supply range that is provided to the ring oscillator. The ring oscillator operates as a voltage controlled oscillator (VCO). A large capacitance is typically used to filter high-frequency noise from the voltage supply of the VCO. In addition, a regulator is typically used to provide the voltage supply to the VCO. The regulator can have a feedback path from the VCO to adjust an output of the regulator. However, the large capacitor can introduce a "pole" at a particular frequency on the feedback path, potentially resulting in instability of the system and causing the output of the regulator to oscillate.

A conventional technique to avoid the potential instability resulting from having the large capacitor on the feedback path is to use a replica of the VCO on the feedback path. The replica is designed to have equivalent characteristics as the actual VCO, but without using the large capacitor. The replica reduces capacitor-induced instability that may otherwise be caused by the capacitor, but the replica may introduce noise and may increase power consumption.

U.S. Pat. No. 7,436,229 ("Sidiropoulos") describes a frequency synthesis circuit that includes a phase locked loop and an interpolator circuit. The phase locked loop circuit receives a reference clock and a feedback clock and generates an output clock with a frequency based on the reference clock and the feedback clock. An interpolator circuit is coupled in the feedback path of the phase locked loop circuit. An interpolator control circuit generates an interpolator control word that specifies a variable time delay for the interpolator circuit. The interpolator circuit receives the output clock, and generates the feedback clock by introducing a variable time delay in the output clock in accordance with the interpolator control word. The time variable delay varies the frequency of the output circuit.

U.S. Pat. No. 8,031,027 ("Park") describes a voltage-controlled oscillator that includes a voltage regulator, and a delay unit. The voltage regulator independently receives a first oscillation control signal and a second oscillation control signal to provide a regulated voltage signal which is represented by a regular ratio of combination of the first and second oscillation control signals, and the regulated voltage signal is feedback to the voltage regulator. The delay unit generates an output signal having a frequency varying in response to the regulated voltage signal.

U.S. Pat. No. 8,217,690 ("Hu") describes a frequency synthesizer that comprises a VCO group, a phase comparator, and a loop filter. Each VCO includes a varactor and a capacitor bank including a plurality of weighted capacitance elements, and a plurality of switches turned ON and OFF based on a control signal. Hu also describes a temperature compensation including a varactor correction potential generation circuit, a correction potential generation circuit for parasitic capacitance of the capacitor bank, a variable gain amplifier in which weighting processing, based on a control signal of the capacitor bank, is performed on an output potential of the correction potential generation circuit, and an adder circuit that adds the output voltage of the correction potential generation circuit of the varactor and output voltage of the variable gain amplifier, and the varactor of the VCO is controlled by output (correction potential) of the adder circuit.

U.S. Pat. Pub. No. 2011/0006819 ("Bazes") describes a processor including digital processing circuitry that receives a digital clock signal from a supply regulated phase locked loop. The supply regulated phase locked loop can include a voltage controlled oscillator that can output an analog signal and a level restorer that can receive the analog signal from the voltage controlled oscillator and can translate the analog output into a digital signal that corresponds to an analog output of the voltage controlled oscillator. The supply regulated phase locked loop can receive an analog input having an input voltage that is within a range of acceptable input voltages. The supply regulated phase locked loop can also be configured to generate the digital output signal, such that the range of acceptable input voltages includes voltage values that are greater than and less than the output voltage.

IEEE Microwave And Wireless Components Letters, Vol. 22, No. 6, June 2012, pages 324-327, from In-Chul Hwang describes a broad-band frequency synthesizer for an L1/L5 dualband GPS RF receiver that is designed to use a four-stage differential ring VCO with an on-chip regulator to compensate for variation by supply and temperature. Also, a pole-zero scalable loop filter is proposed to tune the loop bandwidth while keeping a damping factor against wide variations of VCO gain.

"Low-Power Supply-Regulation Techniques for Ring Oscillators in phase locked loops (PLLs) Using a Split-Turned Architecture" in the IEEE Journal of Solid-State Circuits, vol. 44, No. 8, August 2009, on pages 2169-2181 describes a supply-regulated PLL employing a split-tuned architecture to decouple the tradeoff between supply-noise rejection performance and power consumption. By placing the regulator in the low-bandwidth coarse loop, the proposed PLL architecture allows suppression of the oscillator phase noise. The power supply-noise rejection and the power dissipation of the regulator may not be affected.

"An Area-Efficient PLL Architecture in 90-nm CMOS" in the 2005 Symposium on VLSI Circuits Digest of Technical Papers, on pages 48-49 describes an area-efficient PLL design. The PLL architecture allows the implementation of a charge-pump based PLL stabilization filter network using sample-reset techniques and a total loop-capacitor equivalent to a typical ripple-reduction capacitor.

"A Highly Integrated Power Management IC for Advanced Mobile Applications", IEEE Journal of Solid-State Circuits, Vol. 42, No. 8, August 2007, on pages 1723-1751 describes a highly integrated power management IC (PMIC) which enables mobile devices that are cost effective, thin, compact, and power efficient. The design details of a low-drop-out linear regulator (LDO) and switch-mode DC-DC converter are also discussed, including a frequency compensation method for the LDO.

"A 1.25-5 GHz Clock Generator With High-Bandwidth Supply-Rejection Using a Regulated-Replica Regulator in 45-nm CMOS", IEEE Journal of Solid-State Circuits, Vol. 44, No. 11, November 2008, on pages 2901-2910 describes a clock-generator for high-speed chip-to-chip link receivers implemented in a 45-nm CMOS SOI technology. A low sensitivity to supply voltage noise was achieved by means of a low-dropout voltage regulator using a replica feedback in the regulation loop, where the replica resistance is regulated by a second loop.

III. SUMMARY

Circuits and methods are disclosed that avoid the use of a replica in a voltage controlled oscillator (VCO) by using an oscillator dampening circuit coupled to a regulator. The oscillator dampening circuit may include a "zero" that offsets a "pole" introduced by a large capacitance that is in parallel with the VCO. The oscillator dampening circuit may be responsive to a current provided to the VCO such that the "zero" tracks the "pole" under varying VCO operating conditions.

In a particular embodiment, a circuit includes a voltage controlled oscillator (VCO), a regulator coupled to a supply input of the VCO, and an oscillation dampening circuit coupled to an output of the regulator. An impedance of the oscillation dampening circuit varies based on an amount of current that is provided to the VCO.

In another particular embodiment, a method includes receiving a voltage based on a current provided to a voltage controlled oscillator (VCO) and dampening oscillations using a variable impedance. The variable impedance is responsive to the voltage at an output of a regulator that controls the current provided to the VCO.

In another particular embodiment, a non-transitory computer readable medium includes instructions and the instructions, when executed by a processor, cause the processor to control operations that receive a voltage based on a current provided to a voltage controlled oscillator (VCO) and to dampen oscillations using a variable impedance responsive to the voltage at an output of a regulator that controls the current provided to the VCO.

In another particular embodiment, an apparatus includes means for generating an oscillating signal, means for regulating a supply input of the means for generating, and means for dampening oscillations. The means for dampening oscillations is coupled to an output of the means for regulating. An impedance of the means for dampening oscillations is configured to vary based on an amount of current that is provided to the means for generating.

In another particular embodiment, a circuit includes an oscillation dampening circuit coupled to an output of a regulator, where the oscillation dampening circuit has a first capacitor that has a first terminal coupled to the output of the regulator and a second terminal. A first transistor has a gate terminal, a drain terminal, and a source terminal, where the drain terminal of the first transistor is coupled to the second terminal of the first capacitor, and where the source terminal of the first transistor is coupled to a supply node, and where the gate terminal of the first transistor is coupled to an output of a current mirror circuit. The current mirror circuit mirrors the supply current provided to a voltage controlled oscillator.

At least one advantage provided by the disclosed embodiments is a voltage controlled oscillator (VCO) with reduced instability as compared to a replica-less VCO and with reduced noise and/or power consumption as compared to a circuit that uses replica VCO.

Other aspects, features, embodiments, and variations of the circuitry and methods disclosed herein will become apparent after review of the entire application, including the following sections: Brief Description of the Drawings, Detailed Description, and the Claims.

V. DETAILED DESCRIPTION

Figure 1:
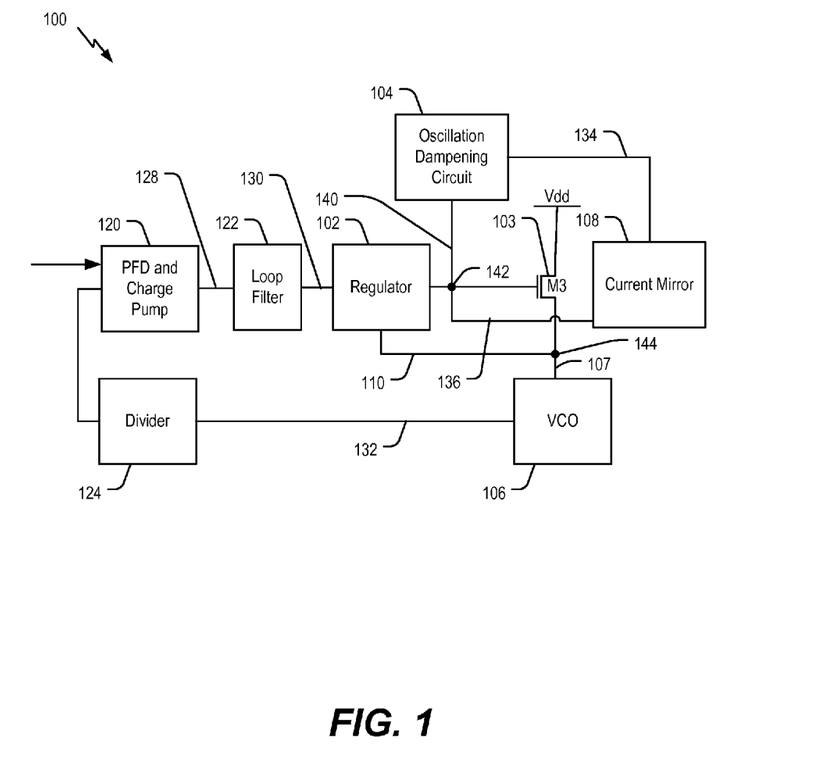
FIG. 1 is a block diagram of a particular illustrative embodiment of a circuit including an oscillator and an oscillation dampening circuit.

FIG. 1 illustrates a phase locked loop (PLL) 100 that includes a regulator 102 to regulate a supply voltage to a VCO 106. An oscillation dampening circuit 104 is coupled to an output of the regulator 102 to substantially dampen or cancel oscillations that may otherwise occur at the output of the regulator 102. The oscillation dampening circuit 104 enables stable operation of the regulator 102 without use of a replica VCO.

The PLL 100 includes a phase-frequency detector (PFD) and charge pump 120 that is configured to receive a reference signal 118 having a reference frequency ($F_{ref}$) and to receive the PLL feedback signal 126 from a divider 124. The PFD and charge pump 120 is configured to provide an output 128 based on a detected phase or frequency difference between the reference signal and the PLL feedback signal. The output 128 of the PFD and charge pump 120 is provided to a loop filter 122. The loop filter 122 is configured to provide a filtered signal 130 to the regulator 102. The regulator 102 is configured to provide an output 136 to a supply transistor M3 103 via a node 142. The supply transistor M3 103 is coupled to the VCO 106 via node 144. An output 132 of the VCO 106 is provided to the divider 124, and the divider 124 is configured to provide the PLL feedback signal 126 to the PFD and charge pump 120.

The output 136 of the regulator 102 controls a voltage and current 107 provided to the VCO 106 in response to the filtered signal 130 from the loop filter 122 and further in response to an input from a feedback loop 110. The feedback loop 110 is coupled to the control node 144 of the VCO 106 and would be susceptible to instability caused by a large capacitance in the VCO 106 or in parallel with the VCO 106 without the oscillation dampening circuit 104.

The oscillation dampening circuit 104 provides an output 140 that is coupled to the node 142 that is coupled to the output of the regulator 102 and is configured to prevent instability caused by a large capacitance in the VCO 106 or in parallel with the VCO 106. A current mirror 108 is coupled to the node 142 and configured to provide an output 134 to the oscillation dampening circuit 104. The output 134 is received by the oscillation dampening circuit 104 as a control signal that is responsive to the VCO current 107. For example, the control signal may have a voltage that is based on a magnitude of the VCO current 107. The oscillation dampening circuit 104 is configured to dampen oscillations at the output of the regulator 102 (e.g., at the node 142) in response to the control signal from the current mirror 108, as explained in further detail with respect to FIG. 2.

By dampening oscillations at the output of the regulator 102, the oscillation dampening circuit 104 also dampens oscillations at the input of the oscillator 106 without using a replica VCO. Avoiding instability at the output of the regulator 102 provides more stable input at the gate of transistor M3 103 and at the input 107 to the VCO 106 without using a replica VCO. Avoiding instability without using a replica VCO may reduce circuit noise and power consumption as compared to a PLL that uses a replica VCO.

Figure 2:
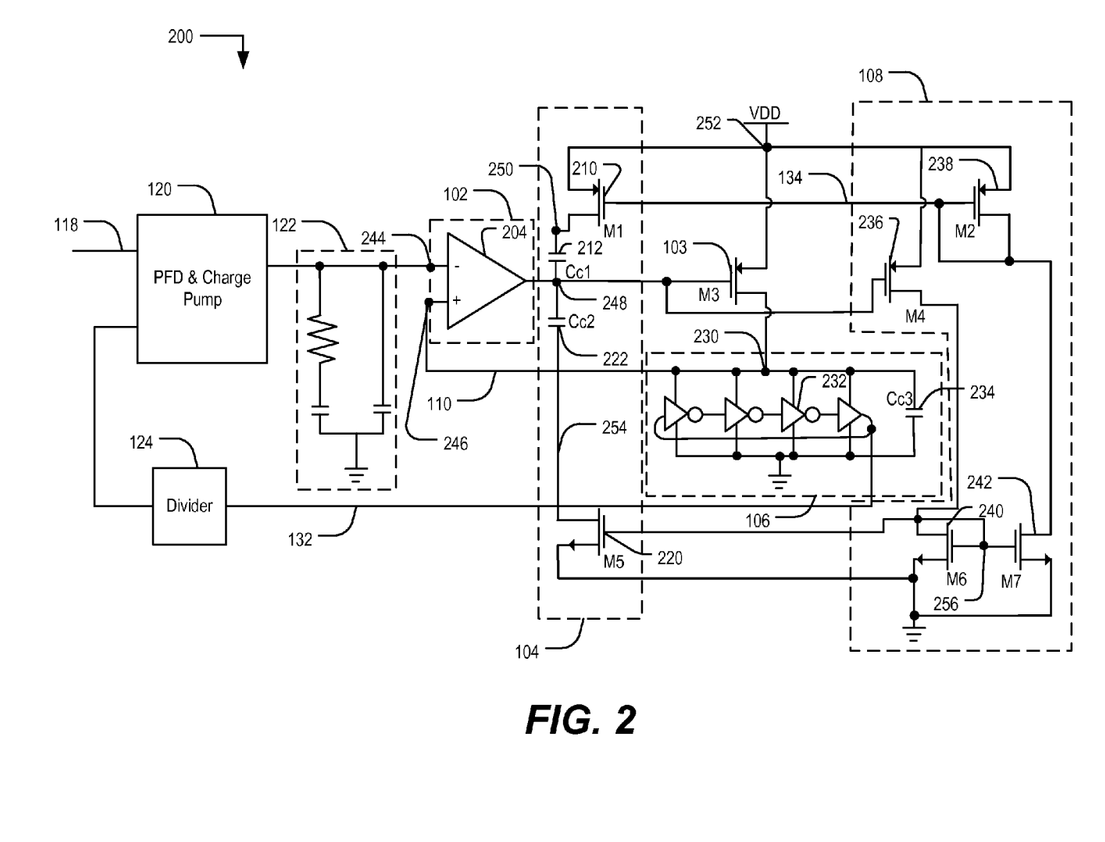
FIG. 2 is a diagram illustrating another particular embodiment of a circuit including an oscillator and an oscillation dampening circuit.

FIG. 2 illustrates a particular embodiment a PLL circuit 200 that includes components of the PLL 100 of FIG. 1. The PLL circuit 200 includes the PFD and charge pump 120, the loop filter 122, the regulator 102, the VCO supply transistor M3 103, the oscillation dampening circuit 104, the VCO 106, the divider 124, and the current mirror 108 of FIG. 1. The VCO 106 provides the output 132 of the PLL circuit 200. The output 132 has a frequency $F_{out}$.

The VCO 106 is illustrated as a ring oscillator of serially coupled inverters including a representative inverter 232. An oscillation frequency of the ring oscillator is responsive to a voltage and/or current provided at the control node 144 of the VCO 106. A capacitor 234 is coupled in parallel with the VCO 106 to filter high-frequency components at the control node 144.

The regulator 102 includes an operational amplifier (op-amp) 204 having an output coupled to the node 142 that is coupled, via the supply transistor M3 103, to a supply input at the control node 144 of the VCO 106. As illustrated, the output of the operational amplifier 204 is coupled to a gate of the VCO supply transistor M3 103, and the VCO supply transistor M3 103 is coupled to provide current to the VCO 106. The regulator 102 is responsive to the loop filter 122 of the PLL 200 and to the feedback loop 110. The feedback loop 110 provides a voltage at an input of the VCO 106 (e.g., at the control node 144) and to an input node 246 of the operational amplifier 204. An output voltage of the loop filter 122 is provided to an input node 244 of the operational amplifier 204.

The oscillation dampening circuit 104 is coupled to an output of the regulator 102 via the node 142. The oscillation dampening circuit 104 includes a resistance-capacitance (RC) circuit. The RC circuit includes a capacitance 212 coupled to the node 142 and to a node 250. The RC circuit further includes a resistance provided by a transistor M1 210. The transistor M1 210 has a gate terminal coupled to receive the output 134 of the current mirror 108. A source of the transistor M1 210 is coupled to a voltage supply via a node 252 and a drain of the transistor M1 210 is coupled to node 250. At least one of the resistance and the capacitance is variable based on an amount of current that is provided to the VCO 106.

For example, at least one of the resistance or the capacitance varies based on an amount of current that is provided to the VCO 106. In the embodiment illustrated in FIG. 2, the transistor M1 210 is biased to operate in a triode mode to provide a variable resistance. The resistance of the transistor M1 210 is substantially proportional to a square root of the amount of current that is provided to the VCO 106.

For example, the current mirror circuit 108 is responsive to the output of the regulator 102 and is configured to provide a voltage to a gate of the transistor M1 210. The current mirror circuit 108 includes a transistor M4 236 that has a gate that is coupled to the node 142. The transistor M4 236 is responsive to the output of the op-amp 204 and mirrors at least a portion of a current through the VCO supply transistor M3 103. The transistor M4 236 is serially coupled to another transistor M6 240 so that the mirror current through the transistor M4 236 flows through the transistor M6 240. The mirror current through the transistor M6 240 generates a voltage at a gate of a transistor M6 240 that is coupled to a gate of a transistor M7 242 and a gate of the transistor M5 220 via a node 256. A current through a pair of serially coupled transistors M2 238 and M7 242 is proportional to the current through the transistors M4 236 and M6 240, and a gate-source voltage of the transistor M2 238 is therefore proportional to the square root of the current through the VCO 106. The gate of the transistor M2 238 provides the output 134 and is coupled to the gate of the transistor M1 210 of the oscillation dampening circuit 104. As a result, the drain-source resistance ($R_{dsm1}$) of the transistor M1 210 is proportional to the square root of the current provided to the VCO 106.

Based on the sizing of the transistor M2 238 and the transistor M1 210, the oscillation dampening circuit 104 is configured to cause a zero of a loop gain of the regulator 102 to cancel a pole at the control node 144 of the VCO 106. For example, the open-loop transfer function of the regulator 102 can be expressed as a ratio of the voltage at the control node 144 (e.g., $V_{reg}$) as compared to the voltage received at the regulator 102 from the loop filter 122 (e.g., $V_{ctrl}$). The open-loop transfer function ($V_{reg}/V_{ctrl}$) of the regulator 102 is proportional to $1/(1+sR_{vco}*C1)$, where $R_{vco}$ is an equivalent resistance of the VCO 106 that is proportional to $1/\sqrt{I_{vco}}$, (where $I_{vco}$ is a current applied to the VCO 106) and C1 is a capacitance of the capacitor 234. $R_{vco}*C1$ corresponds to a pole that is caused by the capacitor 234 and that has a pole frequency that is proportional to the square root of $I_{vco}$.

The oscillation dampening circuit 104 introduces a zero at a frequency corresponding to $(Cc)(R_{dsm1})$, where Cc is the capacitance of the capacitor 212 and $R_{dsm1}$ is the drain-source resistance of the transistor M1 210. As explained above, $R_{dsm1}$ is proportional to the square root of $I_{vco}$, therefore, the oscillation dampening circuit 104 introduces a zero that is proportional to the square root of $I_{vco}$. The capacitance of the capacitor 212 and the physical characteristics of the transistor M1 210 may be selected so that the zero introduced by the oscillation dampening circuit 104 cancels (or substantially cancels) the pole caused by the capacitor 234. The zero also tracks the pole with changes in $I_{vco}$ that may occur as the VCO 106 is tuned and as an impedance of the VCO 106 varies.

In addition to the transistor M1 210 and the capacitor 212, or as an alternative to the transistor M1 210 and the capacitor 212, the oscillation dampening circuit 104 can include a capacitor 222 connected to the node 142 and to the transistor M5 220 through a node 254. A gate of the transistor M5 220 is coupled to the node 256 and therefore mirrors current through the transistor M6 240. The drain-source resistance provided by the second transistor M5 220 varies with the square root of $I_{vco}$ in a similar manner as described with respect to the transistor M1 210. As a result, the transistor M5 220 and the capacitor 222 introduce a zero that may cancel (or substantially cancel) the pole caused by the capacitor 234. The zero tracks the pole with changes in $I_{vco}$.

Although the oscillation dampening circuit 104 is depicted in FIGS. 1 and 2 as implemented in a PLL, in other embodiments the oscillation dampening circuit 104 may instead be implemented in another type of oscillator circuit. Although FIG. 2 depicts the drain-source resistance of the transistor M1 210 (and/or of the second transistor M5 220) as being variable to track the pole, in other embodiments a capacitance of the capacitor 212 (and/or the second capacitor 222) may be variable to track the pole in addition to, or instead of, varying the drain-source resistance of the transistor M1 210 or transistor M5 220. Although the VCO 106 is described as a ring oscillator, in other embodiments the VCO 106 may be another type of oscillator, such as an inductor-capacitor (LC)-type VCO.

Figure 3:
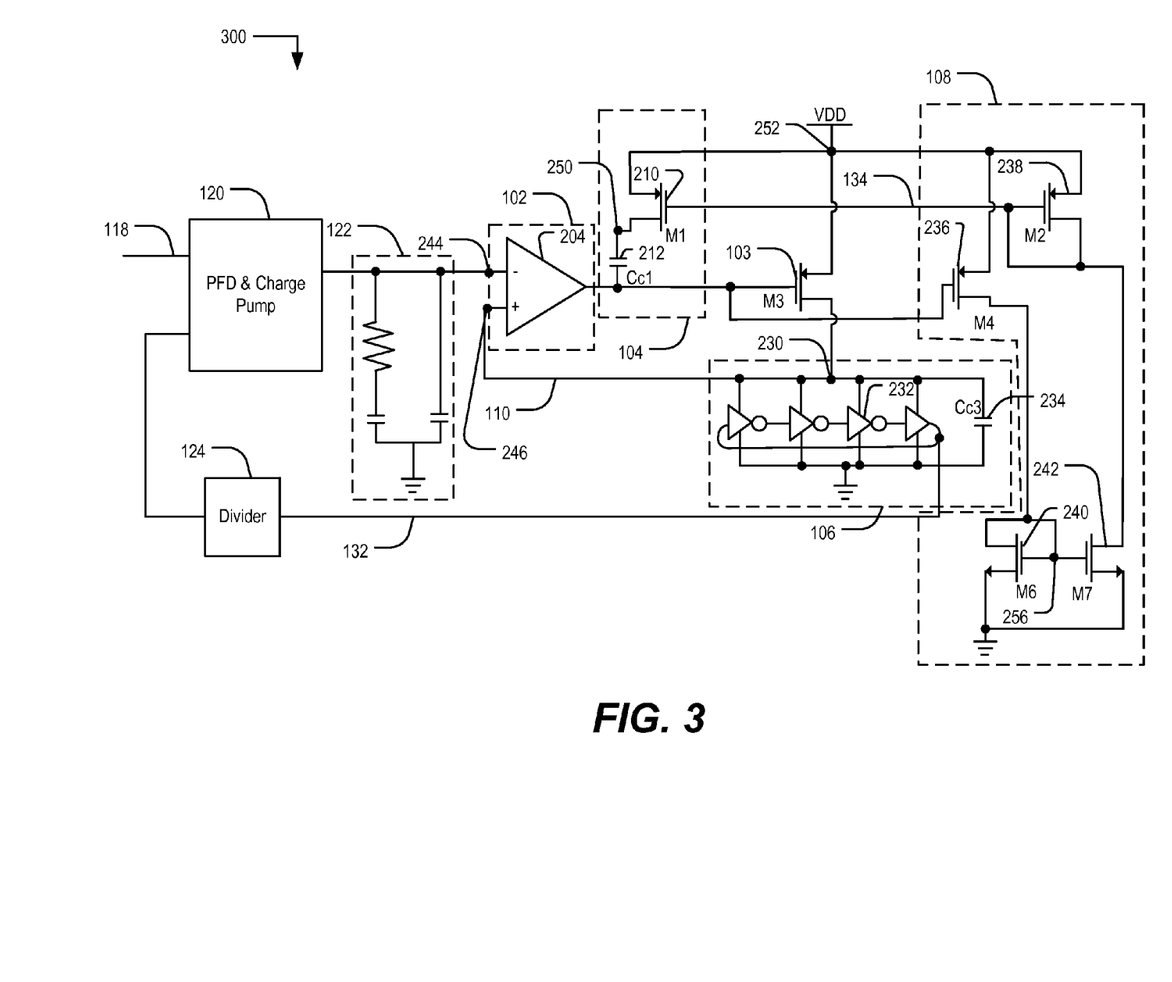
FIG. 3 is a diagram illustrating another particular embodiment of a circuit including an oscillator and an oscillation dampening circuit.

FIG. 3 illustrates a particular embodiment of a PLL circuit 300 that includes components of the PLL 100 of FIG. 1. The PLL circuit 300 includes the PFD and charge pump 120, the loop filter 122, the regulator 102, the VCO supply transistor M3 103, the oscillation dampening circuit 104, the VCO 106, the divider 124, and the current mirror 108 of FIG. 1. The VCO 106 provides the output 132 of the PLL circuit 300. As compared to the PLL 200 of FIG. 2, the oscillation dampening circuit 104 of the PLL circuit 300 of FIG. 3 includes the transistor M1 210 and the capacitor 212, but does not include the capacitor 222 and the transistor M5 220 of FIG. 2. A physical characteristic (e.g., size) of the capacitor 212 and/or the transistor M1 210 are selected to provide oscillation dampening at the node 142 without the contribution of the capacitor 222 and the transistor M5 220 of FIG. 2.

The regulator 102 includes the operational amplifier (op-amp) 204 of FIG. 2 having inputs coupled to the node 244 and to the node 246 and having an output coupled to the node 142.

Based on the sizing of the transistor M2 238 and the transistor M1 210, the oscillation dampening circuit 104 is configured to cause a zero of a loop gain of the regulator 102 to cancel a pole at the control node 144 of the VCO 106 in a similar manner as explained with respect to FIG. 2. The oscillation dampening circuit 104 introduces a zero at a frequency corresponding to $(Cc)(R_{dsm1})$, where Cc is the capacitance of the capacitor 212 and $R_{dsm1}$ is the drain-source resistance of the transistor M1 210. The capacitance of the capacitor 212 and the physical characteristics of the transistor M1 210 may be selected so that the zero introduced by the oscillation dampening circuit 104 cancels (or substantially cancels) the pole caused by the capacitor 234. The zero also tracks the pole with changes in $I_{vco}$ that may occur as the VCO 106 is tuned and as an impedance of the VCO 106 varies.

Although the oscillation dampening circuit 104 is depicted in FIG. 3 as implemented in a PLL, in other embodiments the oscillation dampening circuit 104 may instead be implemented in another type of oscillator circuit. Although FIG. 3 depicts the drain-source resistance of the transistor M1 210 as being variable to track the pole, in other embodiments a capacitance of the capacitor 212 may be variable to track the pole in addition to, or instead of, varying the drain-source resistance of the transistor M1 210. Although the VCO 106 is described as a ring oscillator, in other embodiments the VCO 106 may be another type of oscillator, such as an inductor-capacitor (LC)-type VCO.

Figure 4:
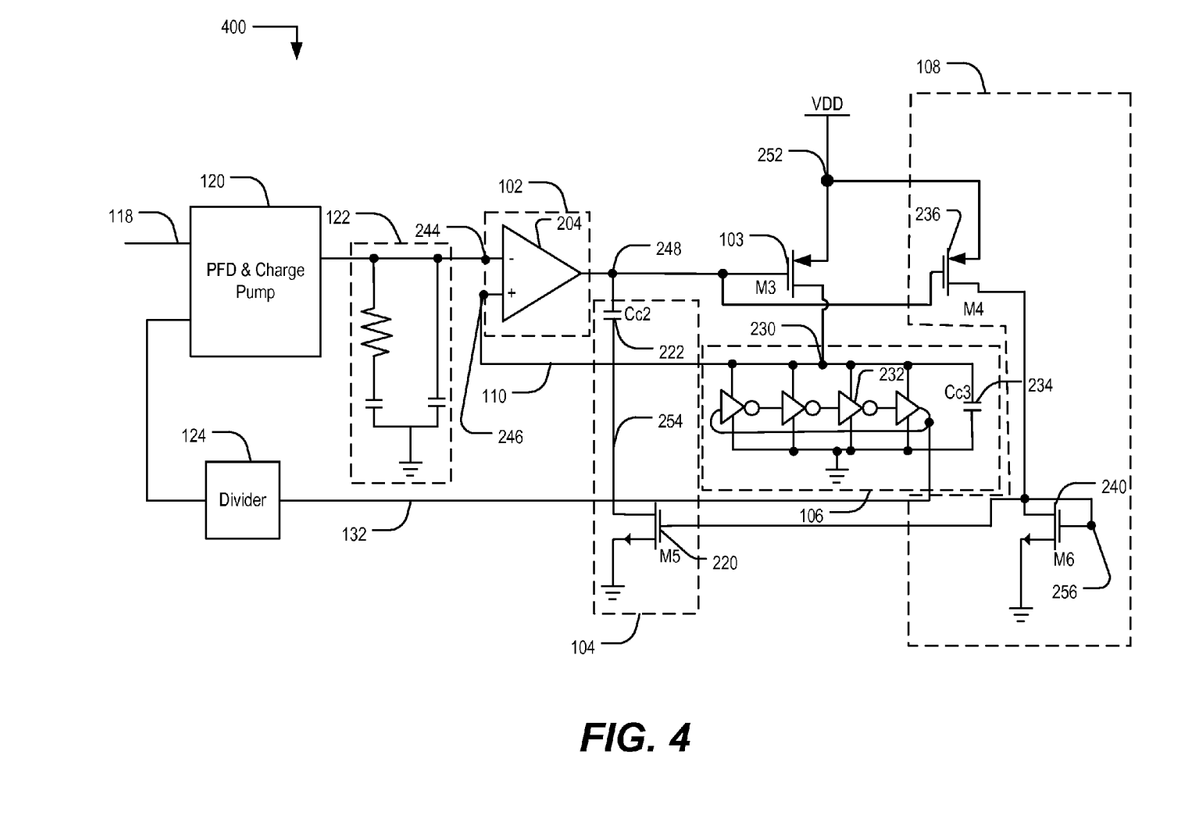
FIG. 4 is a diagram illustrating another particular embodiment of a circuit including an oscillator and an oscillation dampening circuit.

FIG. 4 illustrates a particular embodiment of a PLL circuit 400 that includes components of the PLL 100 of FIG. 1. The PLL circuit 400 includes the PFD and charge pump 120, the loop filter 122, the regulator 102, the VCO supply transistor M3 103, the oscillation dampening circuit 104, the VCO 106, the divider 124, and the current mirror 108 of FIG. 1. The VCO 106 provides the output 132 of the PLL circuit 400. As compared to the PLL 200 of FIG. 2, the oscillation dampening circuit 104 of FIG. 4 includes the transistor M5 220 and the capacitance 222 but does not include the transistor M1 210 and the capacitance 212 of FIG. 2. A physical characteristic (e.g., a size) of the capacitance 220 and/or the transistor M5 222 may be selected to provide oscillation dampening at the node 142 without the contribution of the transistor M5 210 and the capacitance 212 of FIG. 2.

The mirror circuit 108 of FIG. 4 includes the transistor M4 236 and the transistor M6 240 but does not include the transistor M2 238 and the transistor M7 242 of FIG. 2.

Based on the sizing of the transistor M5 220 and the transistor M6 240, the oscillation dampening circuit 104 is configured to cause a zero of a loop gain of the regulator 102 to cancel a pole at the control node 144 of the VCO 106 in a similar manner as explained with respect to FIG. 2. The oscillation dampening circuit 104 introduces a zero at a frequency corresponding to (Cc)(Rdsm1), where Cc is the capacitance of the capacitor 222 and Rdsm1 is the drain-source resistance of the transistor M5 220. The capacitance of the capacitor 222 and the physical characteristics of the transistor M5 220 may be selected so that the zero introduced by the oscillation dampening circuit 104 cancels (or substantially cancels) the pole caused by the capacitor 234. The zero also tracks the pole with changes in Ivco that may occur as the VCO 106 is tuned and as an impedance of the VCO 106 varies.

Although the oscillation dampening circuit 104 is depicted in FIG. 4 as implemented in a PLL, in other embodiments the oscillation dampening circuit 104 may instead be implemented in another type of oscillator circuit. Although FIG. 4 depicts the drain-source resistance of the transistor M5 220 as being variable to track the pole, in other embodiments a capacitance of the capacitor 222 may be variable to track the pole in addition to, or instead of, varying the drain-source resistance of the transistor M5 220. Although the VCO 106 is described as a ring oscillator, in other embodiments the VCO 106 may be another type of oscillator, such as an inductor-capacitor (LC)-type VCO.

Figure 5:
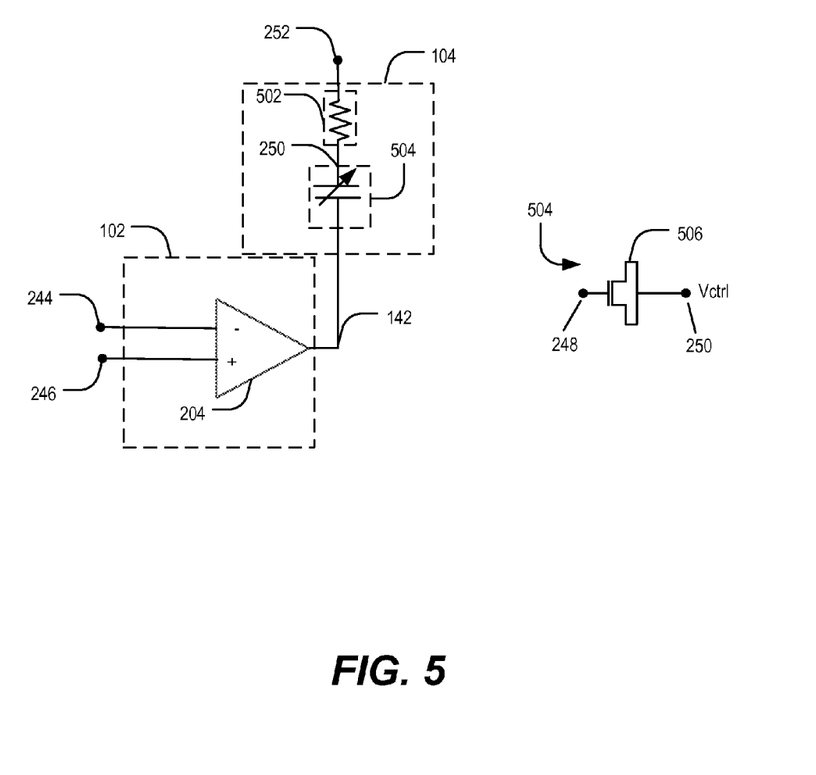
FIG. 5 is a diagram illustrating a particular embodiment of an oscillation dampening circuit.

FIG. 5 illustrates an embodiment of the oscillation dampening circuit 104 and the regulator 102 of FIG. 1. The regulator 102 has the op-amp 204, the input nodes 244 and 246, and is coupled to the node 142 as described with respect to FIGS. 2-4. The oscillation dampening circuit 104 is coupled to the output of the regulator 102 via the node 142. The oscillation dampening circuit 104 includes a variable resistance 502 coupled between the node 252 and the node 250. The oscillation dampening circuit 104 also includes a variable capacitance 504 having a first terminal coupled to the node 250 and a second terminal coupled to the node 142. As compared to the embodiments illustrated in FIGS. 2-4, where the oscillation dampening circuit 104 provides a variable impedance via a variable resistance (e.g., of the transistor M1 210 and/or the transistor M5 220), the oscillation dampening circuit 104 of FIG. 4 provides a variable impedance via the variable capacitance 504.

A value of the variable capacitance 504 may be selected so that the values for the variable capacitance 504 are in relationship to the resistance 502 to cancel or substantially cancel the pole generated by the capacitor 234 of FIGS. 2-4. In one embodiment, the variable capacitance 504 may be implemented using a gate capacitance at a transistor 506. The transistor 506 may have a gate coupled to the node 248 and a source and drain coupled to receive a control voltage $V_{ctrl}$. For example, the source and drain of the transistor 506 may be coupled to the output 134 of the current mirror circuit 108 of FIG. 1. A body terminal of the transistor 506 may be coupled to the node 250, and a gate of the transistor 506 is coupled to the node 142. However, other configurations or implementations of a variable capacitor may be used as the variable capacitance 504.

The variable resistance 502 and the variable capacitance 504 in the oscillation dampening circuit 104 of FIG. 5 may be used to replace the transistor M1 210 and the capacitance 212 of the oscillation dampening circuit 104 of FIG. 2 or 3, or replace the transistor M5 220 and the capacitance 222 of FIG. 2 or 4, or in a combination thereof.

Figure 6:
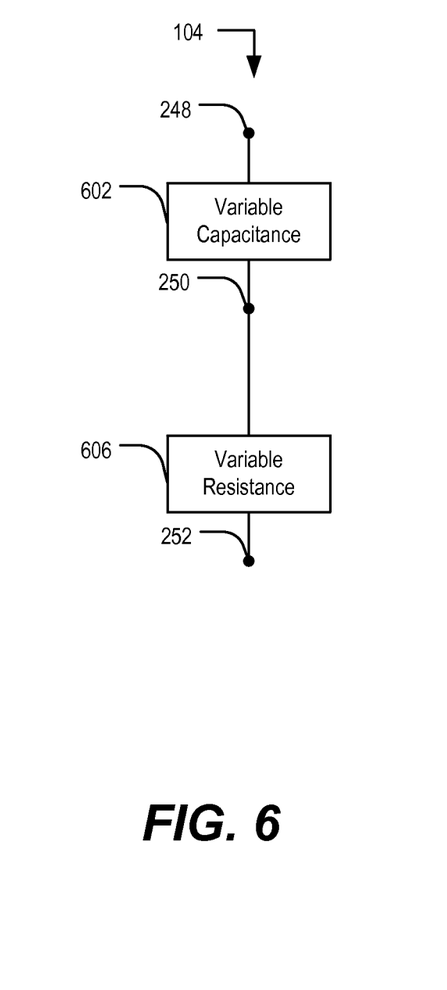
FIG. 6 is a diagram illustrating another particular embodiment of an oscillation dampening circuit.

FIG. 6 illustrates another embodiment of the oscillation dampening circuit 104 that includes a variable capacitance 604 and a variable resistance 606. The variable capacitance 604 is coupled to the node 248 and to the node 250. The variable resistance 606 is coupled to the node 250 and to the node 252. A relationship between the variable capacitance 604 and the variable resistance 606 may be determined so that a zero introduced by the oscillation dampening circuit 104 cancels or substantially cancels the pole generated by the capacitor 234 of FIGS. 2-4.

Figure 7:
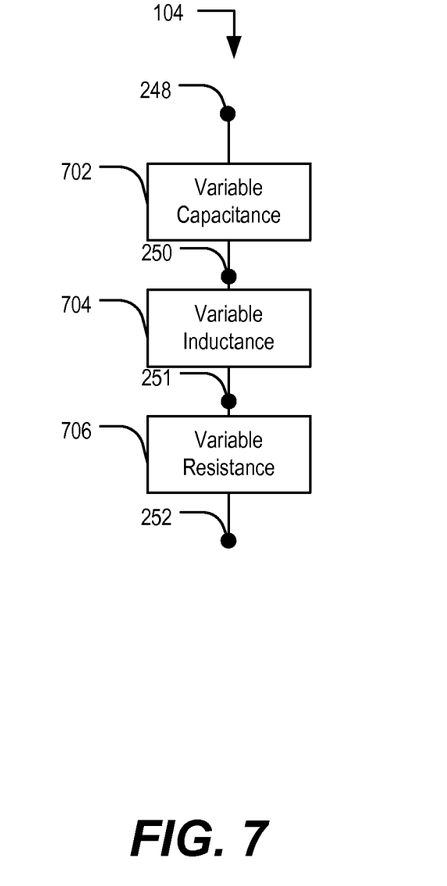
FIG. 7 is a diagram illustrating another particular embodiment of an oscillation dampening circuit.

FIG. 7 illustrates another embodiment of the oscillation dampening circuit 104 that includes a variable inductance 704, a variable resistance 706 and a variable capacitance 702. The variable capacitance 702 is coupled to the node 248 and to the node 250. The variable inductance 704 is coupled to the node 250 and to a node 251. The variable resistance 706 is coupled to node the 251 and to the node 252. The oscillation dampening circuit 104 operates as an RC circuit with a variable impedance that may be determined so that a zero introduced by the oscillation dampening circuit 104 cancels or substantially cancels the pole generated by the capacitor 234 of FIGS. 2-4.

Other embodiments of the oscillation dampening circuit 104 may include circuits where one or more of a capacitance, an inductance, or a resistance is variable and is controlled by a control voltage, such as the output 134 of the current mirror circuit 109. For example, the oscillation dampening circuit 104 may include a variable capacitance and relatively fixed values of inductance and resistance, a variable inductance and relatively fixed values of capacitances and resistance, a variable resistance and relatively fixed values of capacitance and inductance, a variable capacitance and variable inductance and a relatively fixed value of resistance, a variable inductance and variable resistance and relatively fixed value of capacitance, and a variable capacitance and a variable resistance and a relatively fixed value of inductance. A relationship between the capacitance, resistance and inductance may be selected so that a zero introduced by the oscillation dampening circuit 104 cancels or substantially cancels the pole generated by the capacitor 234 of FIGS. 2-4. One benefit of the oscillation dampening circuit, regardless of the particular circuit design used, may be that the oscillation dampening circuit dampens oscillations at the input of the oscillator without using a replica VCO. Thus, use of the oscillation dampening circuit may avoid instability at the output of an regulator without using a replica VCO. Avoiding instability without using a replica VCO may reduce circuit noise and power consumption as compared to a PLL that uses a replica VCO.

Figure 8:
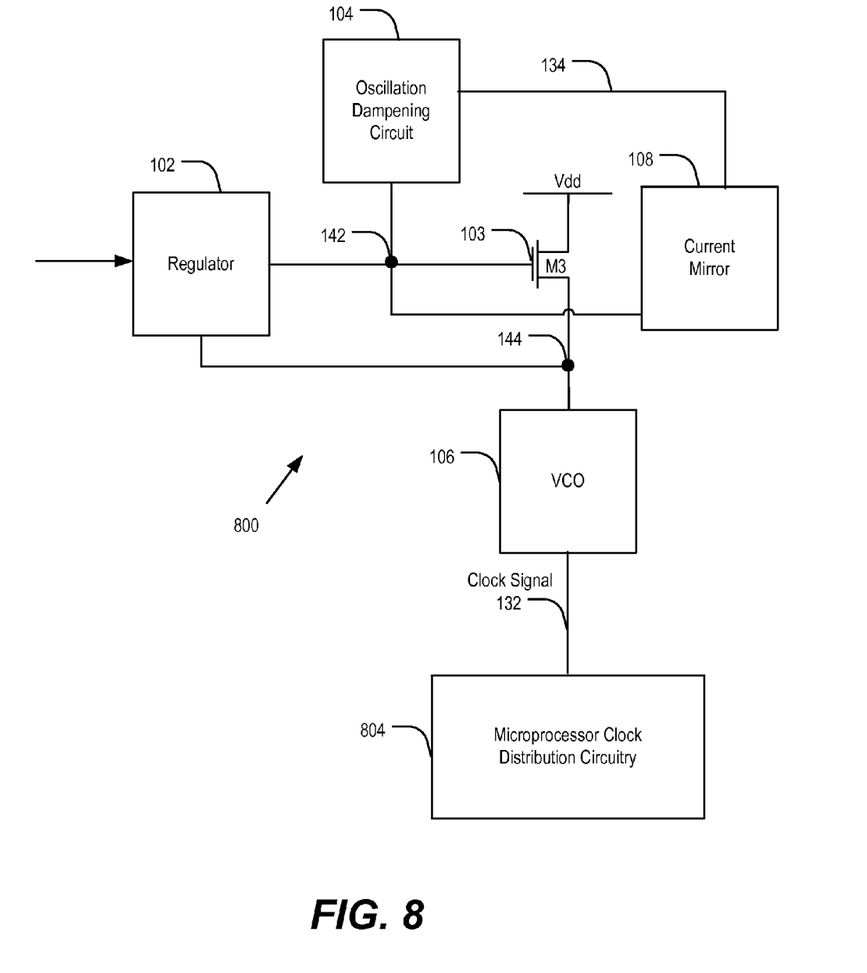
FIG. 8 is a diagram illustrating another particular embodiment of a circuit including an oscillator and an oscillation dampening circuit.

An embodiment of a clock generating circuit 800 coupled to a microprocessor clock distribution circuit is illustrated in FIG. 8. The clock generating circuit 800 includes the regulator 102, the oscillation dampening circuit 104, the current mirror 108 and the VCO 106 of FIG. 1. The regulator 102 accepts an input 802 and is configured to provide an output to the supply transistor M3 103 via the node 142. The supply transistor M3 103 is coupled to the VCO 106 via the node 144. The regulator 102 also provides input to the current mirror 108, and to the oscillation dampening circuit 104 receives the output 134. The output 132 of the VCO 106 is provided as a clock signal to the microprocessor clock distribution circuitry 804. The clock distribution circuit 804 may include one or more buffers or other circuits to provide clocking signals to other circuits such as registers, interfaces, or to other circuits or components.

Figure 9:
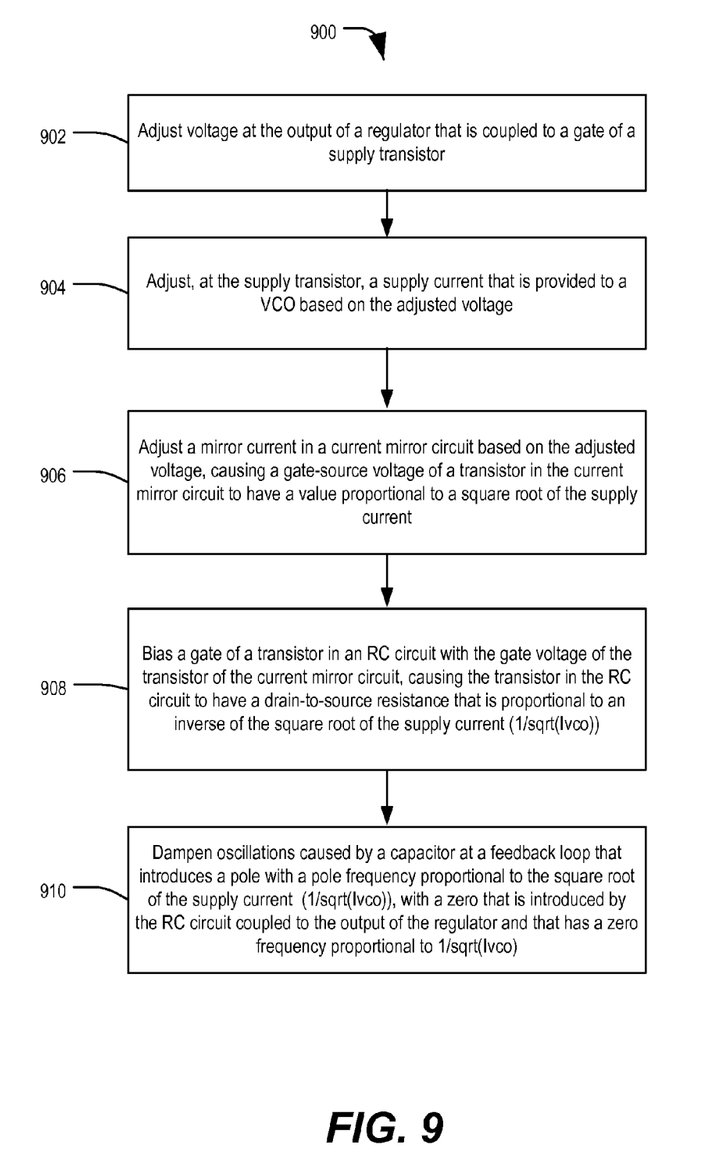
FIG. 9 is a flowchart of one embodiment illustrating a method of dampening oscillations at a VCO.

FIG. 9 illustrates a particular embodiment of a method of using a PLL circuit including an oscillation dampening circuit such as the oscillation dampening circuit 104 of FIGS. 2-8. A voltage is adjusted at the output of a regulator, where the regulator is coupled to a gate of a supply transistor at 902. As the supply transistor has its gate adjusted by the voltage output of the regulator, a supply current is provided to a VCO based on the adjusted gate voltage at 904.

A mirror current is adjusted in a mirror current circuit based on the adjusted voltage, which causes a gate-source voltage of a transistor to mirror a current value proportional to a square root of the supply current at 906.

A gate of a transistor in an RC circuit is biased with the gate voltage of the transistor of the current mirror circuit, causing the transistor in the RC circuit to have a drain-to-source resistance that is proportional to an inverse of the square root of the power supply (1/(sqrt(Ivco)) at 908. For example, the gate of the transistor M1 210 of FIG. 2 is biased by the output 134 of the mirror circuit 108.

The oscillations caused by a capacitor at a feedback loop that introduces a pole with a pole frequency proportional to the square root of the supply current (1/(sqrt(Ivco)) are dampened using a zero introduced by the RC circuit coupled to the output of the regulator having a zero frequency proportional to (1/(sqrt(Ivco)) at 910.

Figure 10:
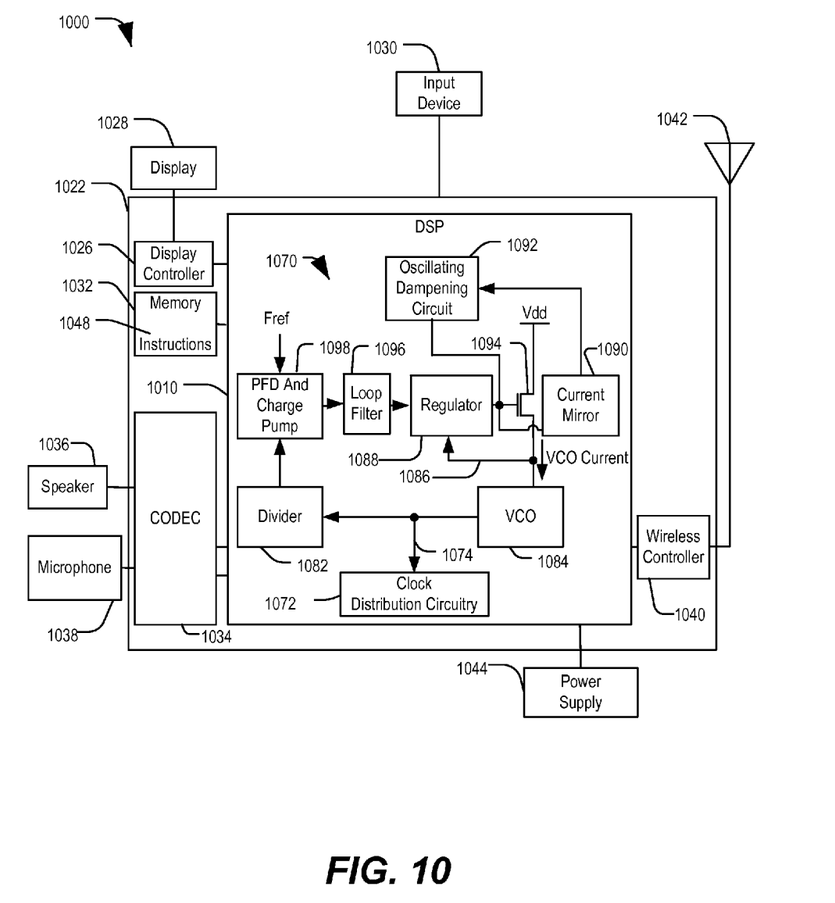
FIG. 10 is a block diagram of a wireless device including an oscillator and an oscillation dampening circuit.

Referring to FIG. 10, a block diagram of a wireless device 1000 is illustrated. The wireless device 1000 includes an oscillator and an oscillation dampening circuit, such as the circuit 104 described with respect to FIGS. 1-8.

The wireless device 1000 includes a processor 1010, such as a digital signal processor (DSP), coupled to a memory 1032. FIG. 10 also shows a display controller 1026 coupled to the processor 1010 and to a display 1028. A coder/decoder (CODEC) 1034 may also be coupled to the processor 1010. A speaker 1036 and a microphone 1038 may be coupled to the CODEC 1034. A wireless controller 1040 may be coupled to the processor 1010 and to an antenna 1042.

In a particular embodiment, the wireless device 1000 includes a subsystem 1070 that is configured to generate a timing reference signal 1074. For example, the timing reference signal 1074 may be provided to clock distribution circuitry 1072 to provide a system clock to one or more components of the wireless device 1000. To illustrate, the system clock may be used by the processor 1010 to regulate an instruction cycle. As another example, the system clock may be provided to the wireless controller 1040 to as a frequency reference to facilitate modulation and/or demodulation of wireless signals. Although the subsystem 1070 is illustrated in FIG. 10 as being contained within the processor 1010, in other embodiments, the subsystem 1070 may be contained within other components of the wireless device 1000, such as within the wireless controller 1040, within the CODEC 1034, or within the display controller 1026.

The subsystem 1070 includes PLL circuitry including a regulator 1088 to regulate a supply voltage to a VCO 1084. An oscillation dampening circuit 1092 is coupled to an output of the regulator 1088. A phase-frequency detector (PFD) and charge pump 1098 receives a reference signal ($F_{ref}$) having a reference frequency and also receives a feedback signal from a divider 1082. The PFD and charge pump 1098 provides an output based on a detected phase or frequency difference between the reference signal and the feedback signal. The output is provided to a loop filter 1096 that provides a filtered signal to the regulator 1088. The regulator 1088 provides an output to a supply transistor 1094 that is coupled to the VCO 1084. An output of the VCO 1084 is provided to the divider 1082. The output of the regulator 1088 controls a voltage and a current to the VCO 1084 in response to input from the loop filter 1096 and input from a feedback loop 1086. A current mirror 1090 provides a control signal to the oscillation dampening circuit 1092. The control signal is responsive to the current to the VCO 1084. The oscillation dampening circuit 1092 dampens oscillations at the output of the regulator 1088 in response to the control signal from the current mirror 1090. To illustrate, the oscillation dampening circuit 1092 may correspond to the oscillation dampening circuit 104 of any of FIGS. 1-8.

The memory 1032 may be, or may include, a tangible non-transitory processor-readable storage medium that includes executable instructions 1048. The instructions 1048 may be executed by a processor, such as the processor 1010, to enable, allow, or control receiving a voltage based on a current provided to the VCO 1084 to enable, allow, or provide a variable resistance or a variable capacitance, or both, responsive to the received voltage to dampen oscillations at an output of the regulator 1088 that controls the current provided to the VCO 1084.

In a particular embodiment, the processor 1010, the display controller 1026, the memory 1032, the CODEC 1034, and the wireless controller 1040 are included in a system-in-package or system-on-chip device 1022. In a particular embodiment, the input device 1030 and the power supply 1044 are coupled to the system-on-chip device 1022. Moreover, in a particular embodiment, the display 1028, the speaker 1036, the microphone 1038, the antenna 1042, and the power supply 1044 are external to the system-on-chip device 1022. However, each of the display 1028, the input device 1030, the speaker 1036, the microphone 1038, the antenna 1042, and the power supply 1044 can be coupled to a component of the system-on-chip device 1022, such as an interface or a controller.

In conjunction with the above-disclosed embodiments, an apparatus is disclosed that includes means for generating an oscillating signal. For example, the means for generating the oscillating signal may include the VCO 106 in FIG. 1 or FIG. 2, one or more ring oscillators, one or more inductance-capacitance (LC)-type oscillators, one or more digital oscillators, a processor configured to execute instructions to generate an oscillating output, one or more other circuits or devices configured to generate an oscillating output, or any combination thereof.

The apparatus also includes means for regulating a supply input of the means for generating. For example, the means for regulating may include the regulator 102 of FIG. 1, the operational amplifier 204 of FIG. 2, one or more other regulator circuits or devices, a processor configured to execute instructions to regulate a supply input, one or more other circuits or devices configured to regulate a supply input, or any combination thereof.

The apparatus also includes means for dampening oscillations. The means for dampening is coupled to an output of the means for regulating. A resistance or a capacitance, or both, of the means for dampening is configured to vary based on an amount of current that is provided to the means for generating. For example, the means for dampening may include the oscillation dampening circuit 104 of FIG. 2 which also includes a resistance M1 210 and a capacitance 212. The resistance M1 210 varies based on an amount of the current 107 supplied to the VCO 106. Alternately or in combination, the means for dampening may include one or more other dampening circuits or devices as shown in FIGS. 3-8, a processor configured to execute instructions to dampen or control dampening of oscillations of a supply input, one or more other circuits or devices configured for dampening oscillations, or any combination thereof.

The means for dampening oscillations may substantially cancel a pole at the means for generating by causing a zero of a loop gain. For example, the means for dampening may be configured such that the transistor M2 238 and the transistor M1 210 in FIG. 2 may cause a zero of the regulator 102, which may cancel a pole at the control node 144 of the VCO 106.

The resistance or the capacitance of the means for dampening may be configured to vary substantially proportionally to a square root of the amount of current that is provided to the means for generating. For example a current through a pair of serially coupled transistors, such as the transistor M2 238 and the transistor M7 242 in FIG. 2, may be proportional to the current through the transistor M4 236 and the transistor M6 240 both in FIG. 2. A gate-source voltage of the transistor M2 238 may be proportional to the square root of the current 107 supplied to the means for generating. The gate of the transistor M2 238 is coupled to the gate of the transistor M1 210 of the oscillation dampening circuit 104. As a result, the drain-source resistance of the transistor M1 210 is proportional to the square root of the current provided to the VCO 106.

Those of skill in this art and having the benefit of the present disclosure would further appreciate that the various illustrative logical blocks, configurations, modules, circuits and algorithm steps described in connection with the embodiments disclosed herein may be implemented as electronic hardware, computer software executed by a processor, or a combination of both. Various illustrative components, blocks, configurations, modules, circuits, and steps have been described above generally in terms of their functionality. Whether such functionality is implemented as hardware or processor executable instructions depends upon the particular application and design constraints imposed on the overall system. Skilled artisans may implement the described functionality in varying ways for each particular application, but such implementation decisions should not be interpreted as causing a departure from the scope of the present disclosure.

A method or algorithm described in connection with the embodiments disclosed herein may be embodied directly in hardware, in a software module executed by a processor, or in a combination of the two. A software module may reside in random access memory (RAM), flash memory, read-only memory (ROM), programmable read-only memory (PROM), erasable programmable read-only memory (EPROM), electrically erasable programmable read-only memory (EEPROM), registers, hard disk, a removable disk, a compact disc read-only memory (CD-ROM), or any other form of non-transient storage medium known in the art. An exemplary storage medium is coupled to the processor such that the processor can read information from, and write information to, the storage medium. In the alternative, the storage medium may be integral to the processor. The processor and the storage medium may reside in an application-specific integrated circuit (ASIC). The ASIC may reside in a computing device or a user terminal. In the alternative, the processor and the storage medium may reside as discrete components in a computing device or user terminal.

The previous description of the disclosed embodiments is provided to enable a person skilled in the art to make or use the disclosed embodiments. Various modifications to these embodiments will be readily apparent to those skilled in the art and who have the benefit of the present disclosure. The principles defined herein may be applied to other embodiments without departing from the scope of the disclosure. Thus, the present disclosure is not intended to be limited to the embodiments shown herein but is to be accorded the widest scope possible consistent with the principles and novel features as defined by the following claims.

What is claimed is:

1. A circuit comprising:
   a voltage controlled oscillator (VCO) having a supply input;
   a regulator having an output coupled to the supply input of the VCO;
   an oscillation dampening circuit comprising a first dampening portion and a second dampening portion, wherein the first dampening portion is coupled between the output of the regulator and a positive supply node providing a current to the supply input of the VCO, wherein an impedance of the oscillation dampening circuit is configured to vary based on the current provided to the supply input of the VCO, and wherein the second dampening portion is coupled between the output of the regulator and a negative supply node; and
   a current mirror circuit configured to mirror the current provided to the supply input of the VCO, wherein the second dampening portion is coupled to the current mirror circuit.

2. The circuit of claim 1, wherein the oscillation dampening circuit causes a zero of a loop gain of the regulator to substantially cancel a pole at a control node coupled to the supply input of the VCO.

3. The circuit of claim 2, wherein the oscillation dampening circuit comprises a first transistor, wherein the first transistor has a gate that is biased to operate the first transistor in a triode mode to provide a variable resistance, the variable resistance being substantially proportional to a square root of the amount of current that is provided to the VCO.

4. The circuit of claim 3, wherein the current mirror circuit has an input coupled to the output of the regulator and an output coupled to the gate of the first transistor and wherein the current mirror circuit is configured to provide a voltage to the gate of the first transistor, the voltage corresponding to the square root of the amount of current that is provided to the VCO.

5. The circuit of claim 1, wherein the regulator comprises an operational amplifier having an output coupled to a gate of a VCO supply transistor, wherein a drain of the VCO supply transistor is coupled to the supply input of the VCO to provide the current to the supply input of the VCO.

6. The circuit of claim 5, further comprising a feedback loop to provide a voltage at the supply input of the VCO to an input of the operational amplifier.

7. The circuit of claim 6, wherein the VCO provides an output of a phase locked loop (PLL) and wherein the regulator has an input that is coupled to an output of a loop filter of the PLL.

8. The circuit of claim 1, wherein the oscillation dampening circuit comprises a resistance-capacitance (RC) circuit.

9. A method for dampening oscillations at a voltage controlled oscillator, the method comprising:
   receiving a voltage based on a current provided to the voltage controlled oscillator (VCO);
   dampening oscillations using a dampening circuit to provide a variable impedance, wherein the dampening circuit comprises a first dampening portion and a second dampening portion, wherein the first dampening portion is coupled between an output of a regulator and a positive supply node providing the current to the VCO, wherein the variable impedance is responsive to the voltage at the output of the regulator that controls the current provided to the VCO, and wherein the second dampening portion is coupled between the output of the regulator and a negative supply node; and
   mirroring the current provided to the VCO via a current mirror circuit, wherein the second dampening portion is coupled to the current mirror circuit.

10. The method of claim 9, wherein the voltage received at the variable impedance further comprises the voltage received at a gate of a transistor in a resistance-capacitance (RC) circuit coupled to the output of the regulator.

11. The method of claim 10 wherein the variable impedance comprises at least one of a variable resistance or a variable capacitance in the RC circuit.

12. The method of claim 11 wherein the at least one of a variable resistance or a variable capacitance comprises a variable resistance in the RC circuit.

13. The method of claim 9, wherein the variable impedance is configurable to cause a zero of a loop gain of the regulator to substantially cancel a pole at a control node of the VCO.

14. A non-transitory computer readable medium comprising instructions wherein the instructions, when executed by a processor cause the processor to control operations comprising:
   receiving a voltage based on a current provided to a voltage controlled oscillator (VCO);
   dampening oscillations using a dampening circuit to provide a variable impedance, wherein the dampening circuit comprises a first dampening portion and a second dampening portion, wherein the first dampening portion is coupled between an output of a regulator and a positive supply node providing the current to the VCO, wherein the variable impedance is responsive to the voltage at the output of the regulator that controls the current provided to the VCO, and wherein the second dampening portion is coupled between the output of the regulator and a negative supply node; and
   mirroring the current provided to the VCO via a current mirror circuit, wherein the second dampening portion is coupled to the current mirror circuit.

15. The non-transitory computer readable medium of claim 14 wherein the voltage received at the variable impedance further comprises the voltage received at a gate of a transistor in a resistance-capacitance (RC) circuit coupled to the output of the regulator.

16. The non-transitory computer readable medium of claim 15 wherein the variable impedance in the RC circuit causes a zero of a loop gain of the regulator to substantially cancel a pole at a control node of the VCO.

17. The non-transitory computer readable medium of claim 16 wherein the variable impedance comprises a variable capacitance in the RC circuit, the variable capacitance causing a zero of a loop gain of the regulator to substantially cancel a pole at a control node of the VCO.

18. An apparatus comprising:
   means for generating an oscillating signal;
   means for regulating a supply input of the means for generating;
   means for dampening oscillations, the means for dampening comprising a first dampening portion and a second dampening portion, wherein the first dampening portion is coupled between an output of the means for regulating and a positive supply node providing a current to the means for generating, wherein an impedance of the means for dampening is configured to vary based on the current that is provided to the means for generating, and wherein the second dampening portion is coupled between the output of the regulator and a negative supply node; and means for mirroring the current provided to the means for generating, wherein the second dampening portion is coupled to the means for mirroring.

19. The apparatus of claim 18 where the means for dampening substantially cancels a pole at the means for generating by causing a zero of a loop gain at the means for regulating.

20. The apparatus of claim 19 wherein the impedance comprises at least one of a variable resistance or a variable capacitance configurable to vary substantially proportionally to a square root of the amount of current that is provided to the means for generating.

21. A circuit comprising:
an oscillation dampening circuit comprising a first dampening portion and a second dampening portion, wherein the first dampening portion is coupled to an output of a regulator and includes:
a first capacitor having a first terminal coupled to the output of the regulator and having a second terminal; and
a first transistor having a gate terminal, a drain terminal, and a source terminal, wherein the drain terminal of the first transistor is coupled to the second terminal of the first capacitor, wherein the source terminal of the first transistor is coupled to a positive supply node, wherein the gate terminal of the first transistor is coupled to an output of a current mirror circuit that is configured to mirror a supply current of a voltage controlled oscillator (VCO), wherein the second dampening portion is coupled between the output of the regulator and a negative supply node, and wherein the second dampening portion is coupled to the current mirror circuit.

22. The circuit of claim 21, wherein the oscillation dampening circuit causes a zero of a loop gain of the regulator to substantially cancel a pole at a control node of the VCO.

23. The circuit of claim 22, wherein the oscillation dampening circuit first transistor provides a variable resistance substantially proportional to a square root of the amount of current that is provided to the VCO.

24. The circuit of claim 21, wherein the second dampening portion comprises:
a second capacitor having a first connection and a second connection; and
a second transistor having a gate connection, a source connection, and a drain connection, wherein the second capacitor first connection is coupled to the output of the regulator, wherein the second capacitor second connection is coupled to the second transistor drain, and wherein the second transistor gate is coupled to the current mirror circuit.

* * * * *